United States Patent
Kimura

(10) Patent No.: US 10,615,291 B2
(45) Date of Patent: Apr. 7, 2020

(54) SEMICONDUCTOR DEVICE AND METHOD OF MANUFACTURING THE SAME

(71) Applicant: TOYOTA JIDOSHA KABUSHIKI KAISHA, Toyota-shi, Aichi-ken (JP)

(72) Inventor: Keisuke Kimura, Nagoya (JP)

(73) Assignee: TOYOTA JIDOSHA KABUSHIKI KAISHA, Toyota-shi (JP)

(*) Notice: Subject to any disclaimer, the term of this patent is extended or adjusted under 35 U.S.C. 154(b) by 0 days.

(21) Appl. No.: 16/255,371

(22) Filed: Jan. 23, 2019

(65) Prior Publication Data
US 2019/0228973 A1 Jul. 25, 2019

(30) Foreign Application Priority Data

Jan. 25, 2018 (JP) ................... 2018-010508

(51) Int. Cl.
| | | |
|---|---|---|
| H01L 29/10 | (2006.01) | |
| H01L 29/32 | (2006.01) | |
| H01L 29/739 | (2006.01) | |
| H01L 27/07 | (2006.01) | |
| H01L 29/861 | (2006.01) | |
| H01L 29/66 | (2006.01) | |
| H01L 29/40 | (2006.01) | |

(52) U.S. Cl.
CPC ........ *H01L 29/861* (2013.01); *H01L 27/0727* (2013.01); *H01L 29/1095* (2013.01); *H01L 29/32* (2013.01); *H01L 29/66136* (2013.01); *H01L 29/66348* (2013.01); *H01L 29/7397* (2013.01); *H01L 29/407* (2013.01)

(58) Field of Classification Search
CPC . H01L 27/0727; H01L 29/1095; H01L 29/32; H01L 29/7397
See application file for complete search history.

(56) References Cited

U.S. PATENT DOCUMENTS

| | | | |
|---|---|---|---|
| 2007/0114598 A1 | 5/2007 | Hotta et al. | |
| 2011/0101416 A1* | 5/2011 | Schulze | H01L 29/0834 257/139 |
| 2015/0008479 A1* | 1/2015 | Kato | H01L 29/6634 257/139 |
| 2016/0315140 A1* | 10/2016 | Iwasaki | H01L 29/32 |

FOREIGN PATENT DOCUMENTS

| | | |
|---|---|---|
| JP | 2005-210047 A | 8/2005 |
| JP | 2007-335747 A | 12/2007 |

\* cited by examiner

*Primary Examiner* — Daniel P Shook
(74) *Attorney, Agent, or Firm* — Hunton Andrews Kurth LLP

(57) ABSTRACT

The semiconductor substrate may include an emitter region, an upper body region being in direct contact with the gate insulating film below the emitter region, an intermediate region being in direct contact with the gate insulating film below the upper body region, a lower body region being in direct contact with the gate insulating film below the intermediate region, a drift region being in direct contact with the gate insulating film below the lower body region, and a collector region being in direct contact with the drift region from below. The lower body region may include a first range and a second range that has a higher crystal defect density than the first range. The second range may be in direct contact with the gate insulating film. The first range may be in direct contact with the second range on a side opposed to the gate insulating film.

5 Claims, 12 Drawing Sheets

SEMICONDUCTOR DEVICE AND METHOD OF MANUFACTURING THE SAME

CROSS-REFERENCE TO RELATED APPLICATION

This application claims priority to Japanese Patent Application No. 2018-010508, filed on Jan. 25, 2018, the entire contents of which are incorporated herein by reference.

TECHNICAL FIELD

The disclosure herewith relates to a semiconductor device acrd a method of manufacturing the same.

BACKGROUND

Japanese Patent Application Publication No. 2005-210047 describes a semiconductor device including a semiconductor substrate, trenches, gate insulating films, and gate electrodes. The trenches are provided in an upper surface of the semiconductor substrate. Each gate insulating film covers an inner surface of its corresponding trench. Each gate electrode is disposed in its corresponding trench, and is insulated from the semiconductor substrate by the gate insulating film. Further, the semiconductor substrate includes emitter regions, an upper body region, an intermediate region, a lower body region, a drift region, and a collector region. The emitter regions are regions of n-type disposed at the upper surface of the semiconductor substrate, and in direct contact respectively with their corresponding gate insulating films. The upper body region is a region of p-type that is in direct contact with the gate insulating films below the emitter regions. The intermediate region is a region of n-type in direct contact with the gate insulating films below the upper body region. The lower body region is a region of p-type in direct contact with the gate insulating films below the intermediate region. The drift region is a region of n-type in direct contact with the gate insulating films below the lower body region. The collector region is a region of p-type in direct contact with the drift region from below.

In the semiconductor device of Japanese Patent Application Publication No. 2005-210047, a flow of holes flowing from the collector region to the upper body region is suppressed by the intermediate region in an on-operation. Due to this, the holes are accumulated in the lower body region and in the drift region below the intermediate region. An increase in a concentration of the holes (that is, minor carriers) in the drift region reduces a resistance in the drift region, and a loss generated in the semiconductor device is thereby reduced.

SUMMARY

As aforementioned, when the semiconductor device of Japanese Patent Application Publication No. 2005-210047 is turned on, the holes are accumulated in the lower body region. When the holes are accumulated in vicinities of the gate insulating films in the lower body region, electrons are attracted to portions of the gate electrodes that are opposed to the lower body region. Since a capacitance is formed between the holes accumulated in the lower body region and the electrons attracted thereto, a gate-emitter capacitance is ostensibly reduced. Hereinbelow, this phenomenon will be termed a negative capacitance effect. Since a gate voltage varies dynamically in response to the gate-emitter capacitance being reduced by the negative capacitance effect, reliability of the semiconductor device is decreased. The disclosure herein provides a technique for suppressing a negative capacitance effect in a semiconductor device provided with an intermediate region.

A semiconductor device disclosed herein may comprise a semiconductor substrate; a trench; a gate insulating film; and a gate electrode. The trench may be provided in an upper surface of the semiconductor substrate. The gate insulating film may cover an inner surface of the trench. The gate electrode may be disposed in the trench and insulated from the semiconductor substrate by the gate insulating film. The semiconductor substrate may comprise an emitter region; an upper body region; an intermediate region; a lower body region; a drift region; and a collector region. The emitter region may be an n-type region which is disposed at the upper surface of the semiconductor substrate and in direct contact with the gate insulating film. The upper body region may be a p-type region which is in direct contact with the gate insulating film below the emitter region. The intermediate region may be an n-type region which is in direct contact with the gate insulating film below the upper body region. The lower body region may be a p-type region which is in direct contact with the gate insulating film below the intermediate region. The drift region may be an n-type region which is in direct contact with the gate insulating film below the lower body region. The collector region may be a p-type region which is in direct contact with the drift region from below. The lower body region may include a first range and a second range that has a higher crystal defect density than the first range. The second range may be in direct contact with the gate insulating film. The first range may be in direct contact with the second range on a side opposed to the gate insulating film.

In the above semiconductor device, the lower body region comprises the first range, and the second range having the higher crystal defect density than the first range. Further, the second range is in direct contact with the gate insulating film, and the first range is in direct contact with the second range on the side opposed to the gate insulating film Crystal defects function as recombination centers. Thus, in the second range having the high crystal defect density, a carrier lifetime is short, Due to this, holes that had flown into the second range in the lower body region disappear within a shorter period of time than holes that had flown into the first range. As a result of this, the holes are less likely to be accumulated in the lower body region in a vicinity of the gate insulating film. Thus, with this semiconductor device, a variation in a gate voltage caused by the negative capacitance effect is less likely to occur when the semiconductor device is turned on.

DETAILED DESCRIPTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide an improved semiconductor device, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

First Embodiment

Figure 1:
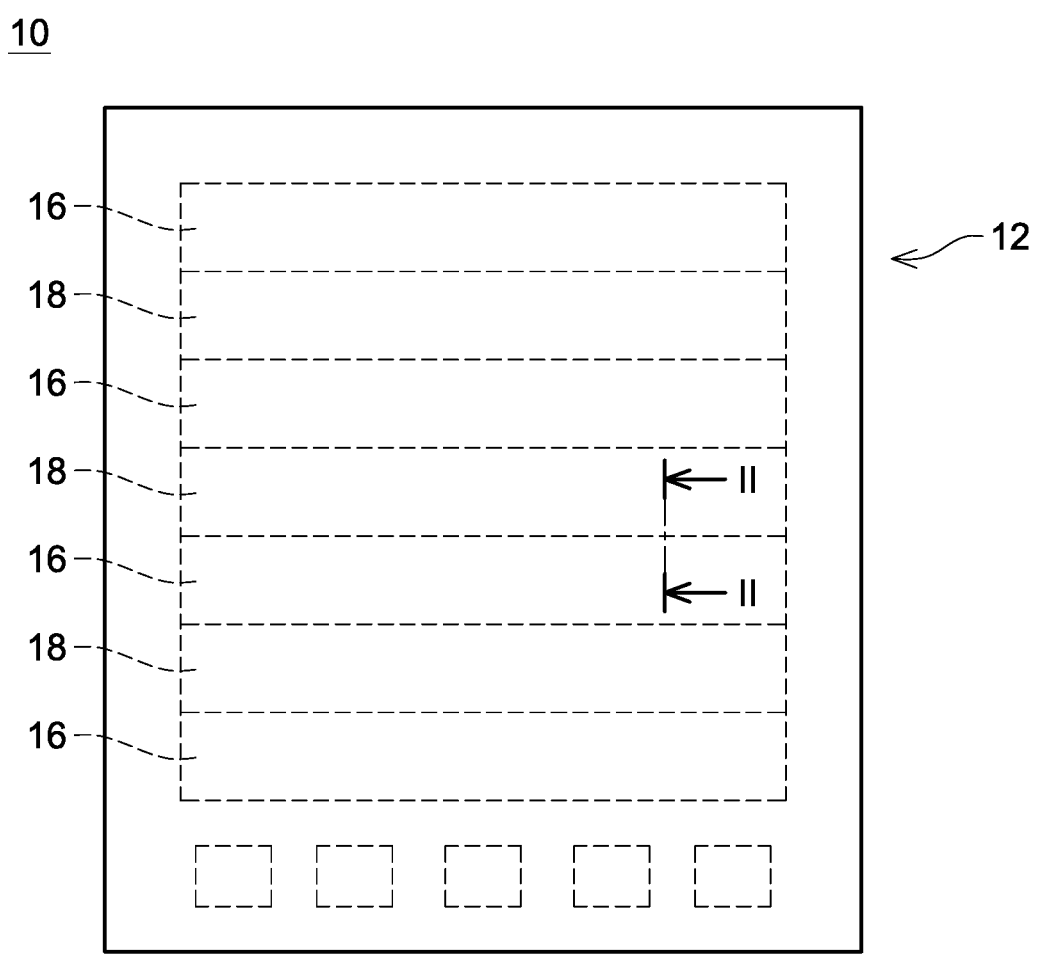
FIG. 1 is a top view of a semiconductor device 10 of a first embodiment.
Figure 2:
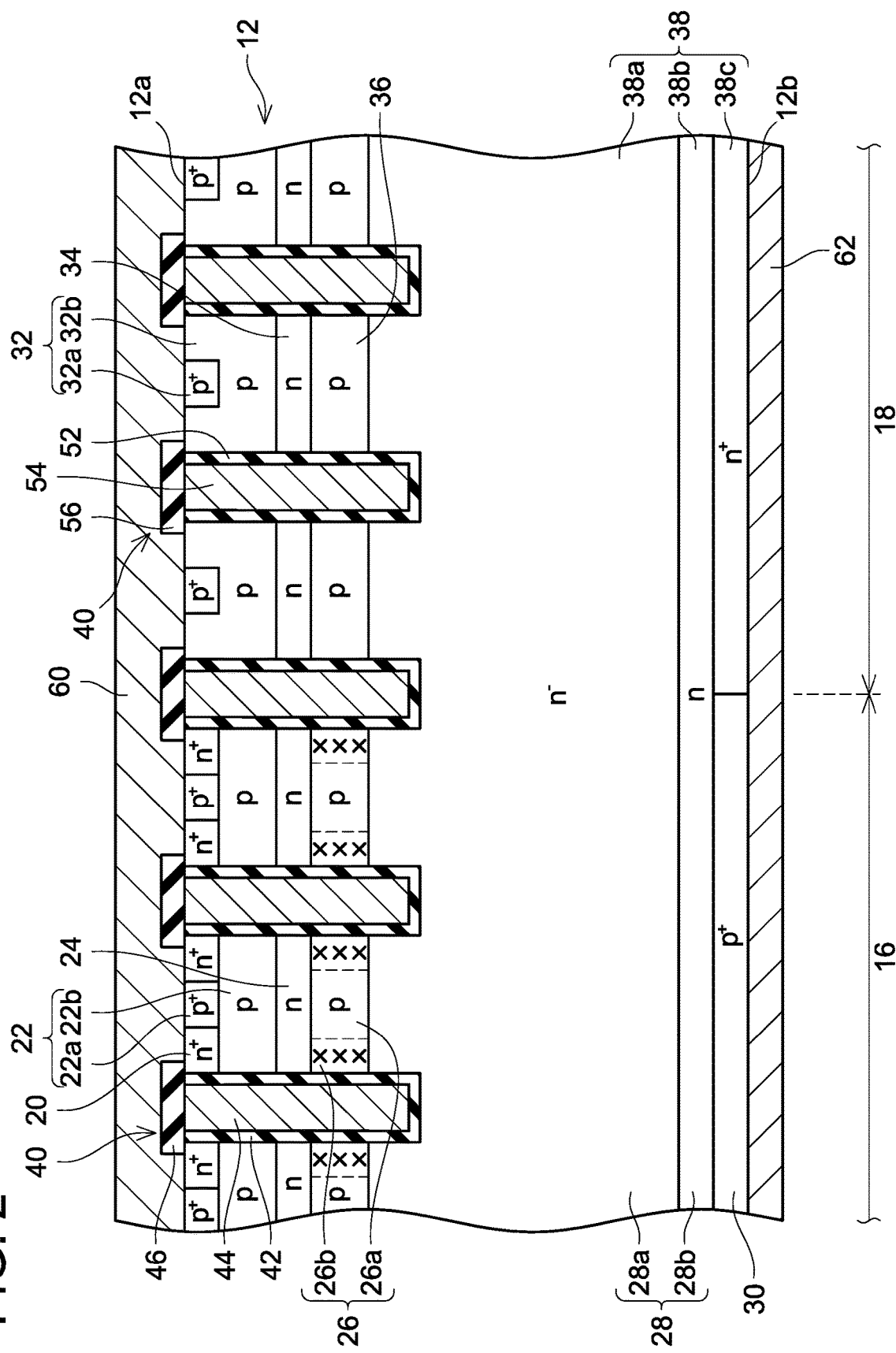
FIG. 2 is a vertical cross-sectional view along a line II-II in FIG. 1.

As shown in FIGS. 1 and 2, a semiconductor device 10 of a first embodiment includes a semiconductor substrate 12, and electrodes and insulators provided on an upper surface 12a and a lower surface 12b of the semiconductor substrate 12. The semiconductor substrate 12 is constituted, for example, of silicon. The semiconductor substrate 12 includes IGBT regions 16 where IGBTs (Insulated Gate Bipolar Transistors) are provided, and diode regions 18 where diodes are provided. That is, the semiconductor device 10 is a so-called RC-IGBT (Reverse Conducting-IGBT). As shown in FIG. 1, the IGBT regions 16 and the diode regions 18 are disposed alternately by being repeated one after another along one direction.

As shown in FIG. 2, a plurality of trenches 40 is provided in the upper surface 12a of the semiconductor substrate 12. The trenches 40 extend parallel to each other in a vertical direction with respect to a sheet surface of FIG. 2. A plurality of trenches 40 is provided in each of the IGBT regions 16 and each of the diode regions 18.

An inner surface of each trench 40 in the IGBT regions 16 is covered by a gate insulating film 42. A gate electrode 44 is disposed in each trench 40 in the IGBT regions 16. Each gate electrode 44 is insulated from the semiconductor substrate 12 by its corresponding gate insulating film 42. An upper surface of each gate electrode 44 is covered by an interlayer insulating film 46.

An inner surface of each trench 40 in the diode regions 18 is covered by an insulating film 52. A control electrode 54 is disposed in each trench 40 in the diode regions 18, Each control electrode 54 is insulated from the semiconductor substrate 12 by its corresponding insulating film 52. An upper surface of each control electrode 54 is covered by an interlayer insulating film 56. A potential of the control electrodes 54 is controlled independent from a potential of the gate electrodes 44.

An upper electrode 60 is provided on the upper surface 12a of the semiconductor substrate 12. The upper electrode 60 is insulated from the gate electrodes 44 by the interlayer insulating films 46, and is insulated from the control electrodes 54 by the interlayer insulating films 56. A lower electrode 62 is provided on the lower surface 12b of the semiconductor substrate 12.

Emitter regions 20, an upper body region 22, an IGBT intermediate region 24, a lower body region 26, a drift region 28, and a collector region 30 are provided inside each IGBT region 16.

The emitter regions 20 are regions of n-type, and are disposed at the upper surface 12a of the semiconductor substrate 12. The emitter regions 20 are in ohmic contact with the upper electrode 60. The emitter regions 20 are in direct contact with the gate insulating films 42.

The upper body region 22 is a region of p-type, and surrounds the emitter regions 20. The upper body region 22 is in direct contact with the gate insulating films 42 below the emitter regions 20. The upper body region 22 includes body contact regions 22a and a low-concentration body region 22b.

The body contact regions 22a are regions of p-type having a high p-type impurity concentration. The body contact regions 22a are disposed at the upper surface 12a of the semiconductor substrate 12. The body contact regions 22a are in ohmic contact with the upper electrode 60. The body contact regions 22a are each adjacent to the emitter regions.

The low-concentration body region 22b is a region of p-type having a lower p-type impurity concentration than the body contact regions 22a, The low-concentration body region 22b is provided below the emitter regions 20 and the body contact regions 22a. The low-concentration body region 22b is in direct contact with the gate insulating films 42 below the emitter regions 20.

The IGBT intermediate region 24 is a region of n-type, and is provided below the upper body region 22 (that is, below the low concentration body region 22b). The IGBT intermediate region 24 is separated from the emitter regions 20 by the upper body region 22. The IGBT intermediate region 24 is in direct contact with the gate insulating films 42 below the upper body region 22.

The lower body region 26 is a region of p-type and is provided below the IGBT intermediate region 24. The lower body region 26 is separated from the upper body region 22 by the IGBT intermediate region 24. The lower body region 26 is in direct contact with the gate insulating films 42 below the IGBT intermediate region 24. The lower body region 26 includes a low-density crystal defect range 26a and high-density crystal defect ranges 26b. A crystal defect density of the high-density crystal defect ranges 26b is higher than a crystal defect density of the low-density crystal defect range 26a.

The high-density crystal defect ranges 26b are each disposed in ranges in direct contact with their corresponding gate insulating films 42. The low-density crystal defect range 26a is in direct contact with the high-density crystal defect ranges 26b on a side opposed to the gate insulating films 42. That is, the low-density crystal defect range 26a is disposed between each pair of the trenches 40 by being interposed between a pair of the high-density crystal defect ranges 26b.

The drift region 28 is a region of n-type, and is provided below the lower body region 26. The drift region 28 is separated from the IGBT intermediate region 24 by the lower body region 26. The drift region 28 includes a low-concentration drift region 28a and a buffer region 28b.

The low-concentration drift region 28a is a region of n-type having a lower n-type impurity concentration than the emitter regions 20. The low-concentration drift region 28a is provided below the lower body region 26. The low-concentration drift region 28a is separated from the IGBT intermediate region 24 by the lower body region 26. The low-concentration drift region 28a is in direct contact with the gate insulating films 42 in vicinities of lower ends of the trenches 40 below the lower body region 26.

The buffer region 28b is a region of n-type having a higher n-type impurity concentration than the low-concentration drift region 28a. The buffer region 28b is provided below the low-concentration drift region 28a.

The collector region 30 is a region of p-type having p-type impurities in a high concentration. The collector region 30 is provided below the drift region 28 (that is, below the buffer region 28b). The collector region 30 is separated from the lower body region 26 by the drift region 28. The collector region 30 is disposed at the lower surface 12b of the semiconductor substrate 12. The collector region 30 is in ohmic contact with the lower electrode 62.

In each of the IGBT regions 16, an IGBT connected between the upper electrode 60 and the lower electrode 62 is constituted of the emitter regions 20, the upper body region 22, the IGBT intermediate region 24, the lower body region 26, the drift region 28, the collector region 30, the gate electrodes 44 and the like. In a case where the semiconductor device 10 is to operate as an IGBT, the upper electrode 60 is an emitter electrode, and the lower electrode 62 is a collector electrode.

An upper anode region 32, a diode intermediate region 34, a lower anode region 36, and a cathode region 38 are provided inside each diode region 18.

The upper anode region 32 is a region of p-type, and is disposed at the upper surface 12a of the semiconductor substrate 12. The upper anode region 32 is in direct contact with the insulating films 52. The upper anode region 32 includes anode contact regions 32a and a low-concentration anode region 32b.

The anode contact regions 32a are regions of p-type having p-type impurities in a high concentration. The anode contact regions 32a are disposed at the upper surface 12a of the semiconductor substrate 12. The anode contact regions 32a are in ohmic contact with the upper electrode 60.

The low-concentration anode region 32b is a region of p-type having a lower p-type impurity concentration than the anode contact regions 32a. The low-concentration anode region 32b is provided in a region surrounding the anode contact regions 32a including regions below the anode contact regions 32a. The low-concentration anode region 32b is in direct contact with the insulating films 52. Parts of the low-concentration anode region 32b are disposed at the upper surface 12a of the semiconductor substrate 12 at positions adjacent to the anode contact regions 32a.

The diode intermediate region 34 is a region of n-type, and is provided below the upper anode region 32 (that is, below the low-concentration anode region 32b). The diode intermediate region 34 is in direct contact with the insulating films 52 below the upper anode region 32. The diode intermediate region 34 is disposed at a substantially same depth as the IGBT intermediate region 24 in the IGBT region 16.

The lower anode region 36 is a region of p-type, and is provided below the diode intermediate region 34. The lower anode region 36 is separated from the upper anode region 32 by the diode intermediate region 34. The lower anode region 36 is in direct contact with the insulating films 52 below the diode intermediate region 34. The lower anode region 36 is disposed at a substantially same depth as the lower body region 26 in the IGBT region 16.

The cathode region 38 is a region of n-type that is continuous from the drift region 28. The cathode region 38 is provided below the lower anode region 36. The cathode region 38 is separated from the diode intermediate region 34 by the lower anode region 36. The cathode region 38 is disposed at the lower surface 12b of the semiconductor substrate 12. The cathode region 38 is in ohmic contact with the lower electrode 62. The cathode region 38 includes a low-concentration drift region 38a, a buffer region 38b, and a cathode contact region 38c.

The low-concentration drift region 38a is provided below the lower anode region 36. The low-concentration drift region 38a is separated from the diode intermediate region 34 by the lower anode region 36. The low-concentration drift region 38a is in direct contact with the insulating films 52 in vicinities of lower ends of the trenches 40 below the lower anode region 36. The low-concentration drift region 38a has a substantially same n-type impurity concentration as the low-concentration drift region 28a in each IGBT region 16. The low-concentration drift region 38a is continuous from the low concentration drill region 28a in the IGBT region 16.

The buffer region 38b is provided below the low-concentration drift region 38a. The buffer region 38b is a region of n-type having a higher n-type impurity concentration than the low-concentration drift region 38a. The buffer region 38b has a substantially same n-type impurity concentration as the buffer region 28b in the IGBT region 16. The buffer region 38b is continuous from the buffer region 28b in the IGBT region 16.

The cathode contact region 38c is a region of n-type having a higher n-type impurity concentration than the buffer region 38b. The cathode contact region 38c is provided below the buffer region 38b. The cathode contact region 38c is disposed at the lower surface 12b of the semiconductor substrate 12. The cathode contact region 38c is in ohmic contact with the lower electrode 62, The cathode contact region 38c is adjacent to the collector region 30 in the IGBT region 16.

In each of the diode regions 18, a diode connected between the upper electrode 60 and the lower electrode 62 is constituted of the upper anode region 32, the diode intermediate region 34, the lower anode region 36, the cathode region 38 and the like. In a case where the semiconductor device 10 is to operate as a diode, the upper electrode 60 is an anode electrode, and the lower electrode 62 is a cathode electrode. That is, the diodes are connected in inverse parallel with respect to the IGBTs.

Next, operation of the semiconductor device 10 will be described, Firstly, an operation of each IGBT will be described. A case will be considered in which a potential of the gate electrodes 44 is increased in a state where a voltage by Which the lower electrode 62 comes to have a higher potential than the upper electrode 60 is applied. When the potential of the gate electrodes 44 increases, channels are forged in the upper body region 22 and the lower body region 26 in their ranges adjacent to the gate insulating films 42. Then, electrons flow from the upper electrode 60 toward the lower electrode 62 through the emitter regions 20, the channels in the upper body region 22, the JUST intermediate region 24, the channels in the lower body region 26, the drift region 28, and the collector region 30. Further, holes flow from the lower electrode 62 towards the upper electrode 60 through the collector region 30, the drift region 28, the lower body region 26, the IGBT intermediate region 24, and the upper body region 22. At this occasion, the flow of the holes flowing from the collector region 30 toward the upper body region 22 is suppressed by the IGBT intermediate region 24. Due to this, the holes are accumulated in the lower body region 26 and the drift region 28 located below the IGBT intermediate region 24. As such, upon when the semiconductor device 10 is turned on, a concentration of the holes (that is, minor carriers) in the drift region 28 increases, by Which a resistance in the drift region 28 is reduced, and a loss generated in the semiconductor device 10 is reduced.

Figure 3:
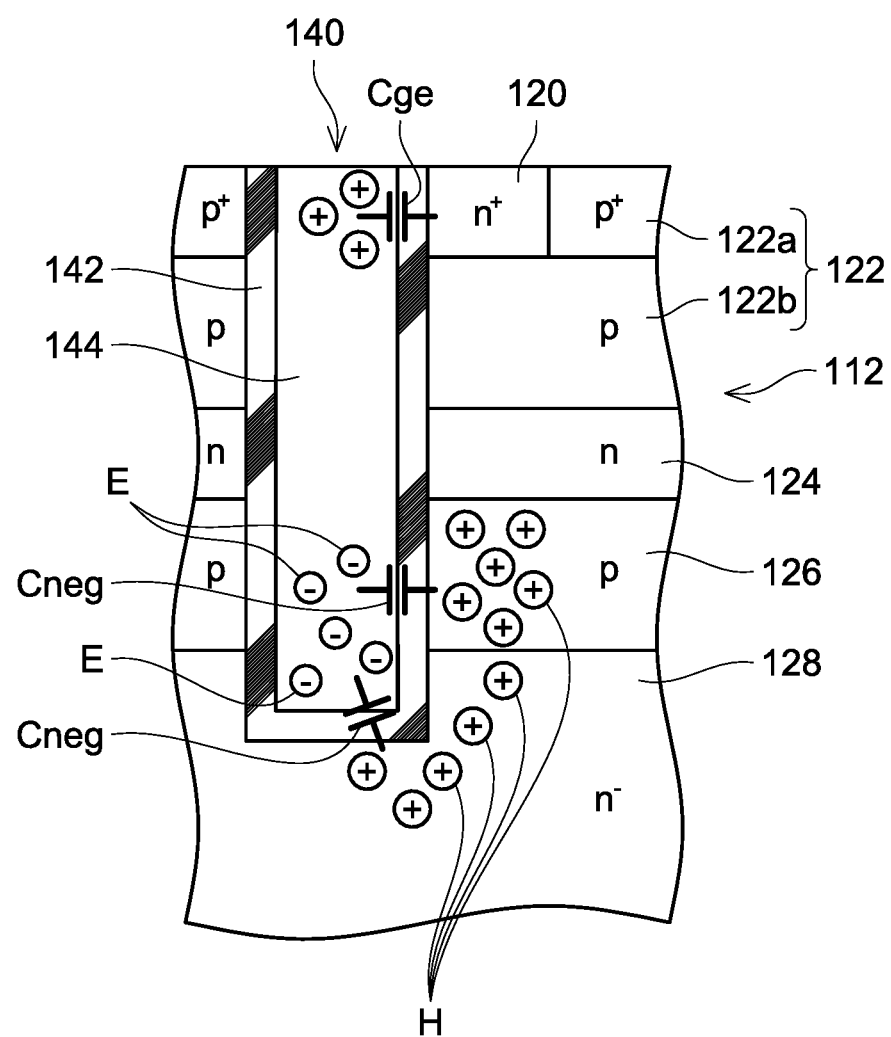
FIG. 3 is a cross-sectional view of a primary portion of a semiconductor device of a comparative example, and is a diagram for explaining a negative capacitance effect.

Here, a negative capacitance effect will be described with reference to FIG. 3. FIG. 3 shows a configuration of a semiconductor device of a comparative example, and is a diagram corresponding to a vicinity of one of the trenches 40 in the IGBT region 16 of FIG. 2. As shown, in FIG. 3, this semiconductor device includes a trench 140, a gate insulating film 142 covering an inner surface of the trench 140, and a gate electrode 144 disposed in the trench 140. Further, a semiconductor substrate 112 includes an emitter region 120, an upper body region 122 (a body contact region 122a and a low-concentration body region 122b), an IGBT intermediate region 124, a lower body region 126, and a drift region 128. A configuration on an upper side than the semiconductor substrate 112 is omitted from the drawing. In this semiconductor device, unlike the semiconductor device 10 of the embodiment, an n-type impurity concentration of the IGBT intermediate region 124 is substantially constant. Further, as compared to the semiconductor device 10 of the embodiment, a crystal defect density in the lower body region 126 in a vicinity of the gate insulating film 142 is low.

In the semiconductor device of the comparative example, when a potential of the gate electrode 144 increases, holes H supplied from a lower electrode (not shown) are accumulated in the lower body region 126 and the drift region 128. At this occasion, the holes H accumulated in the vicinity of the gate insulating film 142 attract electrodes E in the gate electrode 144. Capacitances Cneg are thereby formed by the holes H and the electrons E. The capacitances Cneg formed at this occasion accumulate charges that are inverse in positive and negative to charges of a gate-emitter capacitance Cge, so the gate-emitter capacitance Cge seems decrease ostensibly. As above, a phenomenon in which a gate-emitter capacitance decreases by elections induced in the gate electrode 144 is called the negative capacitance effect.

Figure 4:
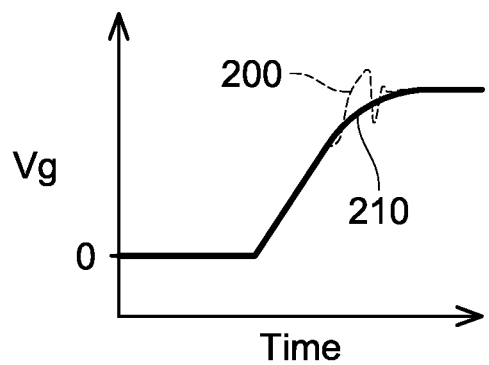
FIG. 4 is a diagram showing gate voltages upon turn-on of the semiconductor device 10 of the first embodiment and the semiconductor device of the comparative example.
Figure 5:
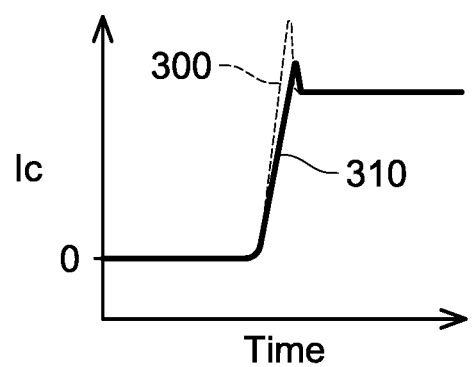
FIG. 5 is a diagram showing current values upon turn-on of the semiconductor device 10 of the first embodiment and the semiconductor device of the comparative example.
Figure 6:
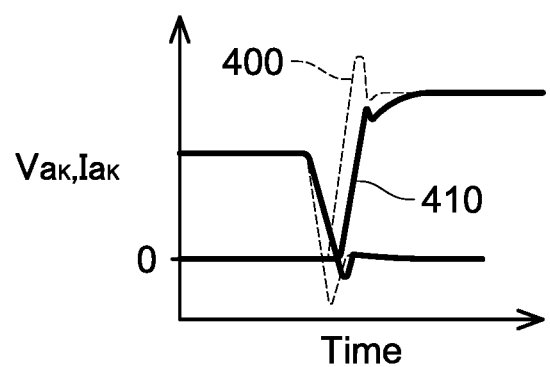
FIG. 6 is a diagram showing surge voltages applied to a diode when the semiconductor device 10 of the first embodiment and the semiconductor device of the comparative example are each connected serially with the diode.

In the semiconductor device of the comparative example, when the aforementioned negative capacitance effect occurs, a gate voltage Vg rises sharply in the course of charging the gate electrode 144, as shown by a broken line 200 in FIG. 4. As a result, as shown by a broken line 300 in FIG. 5, a large current Ic flows in the semiconductor device. Thus, in the semiconductor device of the comparative example, a switching loss increases. Further, the gate voltage might exceed a breakdown voltage of the gate electrode 144, and a gate leak current increases in some cases. Further, in a case where the semiconductor device of the comparative example and a diode (not shown) are connected serially (such as in an inverter), a large surge voltage Vak is applied to the diode when the semiconductor device is turned on (that is, when the diode switches from on to off and a reverse recovery current Iak flows), as shown by a broken line 400 in FIG. 6.

On the other hand, in the semiconductor device 10 of the present embodiment, the lower body region 26 includes the low-density crystal defect range 26a and the high-density crystal defect ranges 26b having the higher crystal defect density than the low-density crystal defect range 26a. Further, the high-density crystal defect ranges 26b are disposed in the ranges in direct contact with the gate insulating films 42. Since crystal defects function as recombination centers, a carrier lifetime is short in the high-density crystal defect ranges 26b having the high crystal defect. Due to this, the holes that had flown from the collector region 30 to the high-density crystal defect ranges 26b of the lower body region 26 disappear within a short period of time. As a result, the holes are less likely to be accumulated in the high-density crystal defect ranges 26b (that is, in the lower body region 26 in vicinities of the gate insulating films 42).

As described above, the accumulation of the holes in the high-density crystal defect ranges 26b is suppressed by the high-density crystal defect ranges 26b. Thus, in this semiconductor device 10, the negative capacitance effect can be suppressed.

As a result, as shown by a solid line 210 in FIG. 4, a sharp rise in a gate voltage caused by the negative capacitance effect can be suppressed in a course of increasing a potential of the gate electrodes 44. Due to this, when the gate electrodes 44 are charged, the gate voltage can be suppressed from greatly varying. As a result, as shown by a solid line 310 in FIG. 5, a large current can be suppressed from flowing in the semiconductor device 10. Further, in a case where the semiconductor device 10 and a diode (not shown) are connected serially (such as in an inverter), a large surge voltage Vak can be suppressed from being applied to the diode when the semiconductor device 10 is turned on (that is, when the diode switches from on to off and a reverse recovery current Iak flows), as shown by a solid line 410 in FIG. 6. Thus, reliability of the semiconductor device 10 can be improved.

After this, when the potential of the gate electrodes 44 is decreased, the channels disappear and the IGBT is turned off.

Next, an operation of each diode will be described. When the diode is turned on, a voltage by which the upper electrode 60 comes to have a higher potential than the lower electrode 62 is applied. By so doing, a current flows from the upper electrode 60 to the lower electrode 62 through the anode contact regions 32a, the low-concentration anode region 32b, the diode intermediate region 34, the lower anode region 36, and the cathode region 38. After this, when the voltage between the lower electrode 62 and the upper electrode 60 is switched to a reverse voltage, the diode performs a reverse recovery operation. That is, holes accumulated in the low-concentration drift region 38a in the diode region 18 are discharged to the upper electrode 60 through the lower anode region 36, the diode intermediate region 34, and the upper anode region 32, Due to this, a reverse recovery current flows in the diode. When the holes accumulated in the low-concentration drift region 38a are discharged, the diode is turned off.

Figure 7:
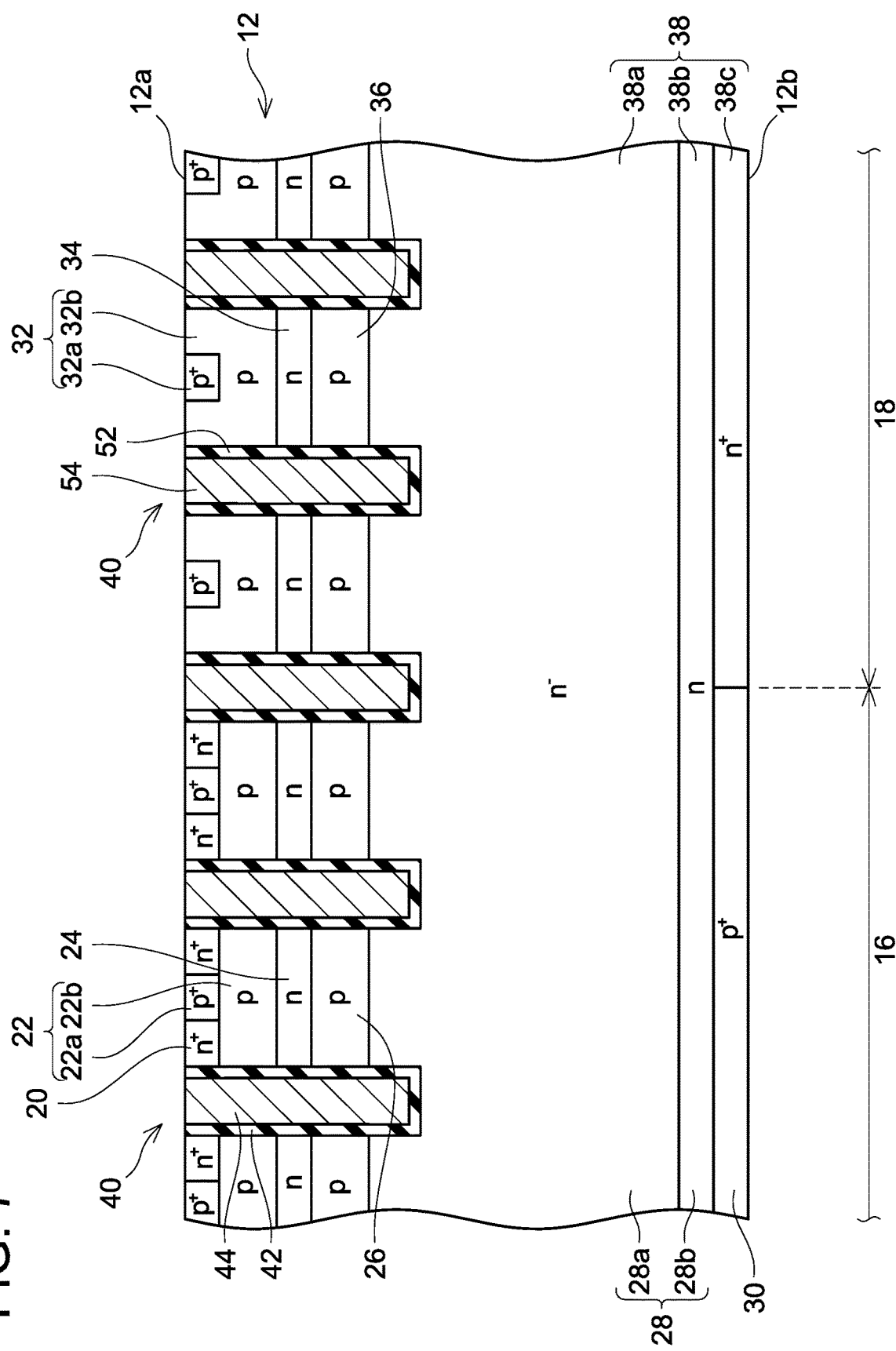
FIG. 7 is an explanatory diagram of a manufacturing process of the semiconductor device 10.
Figure 8:
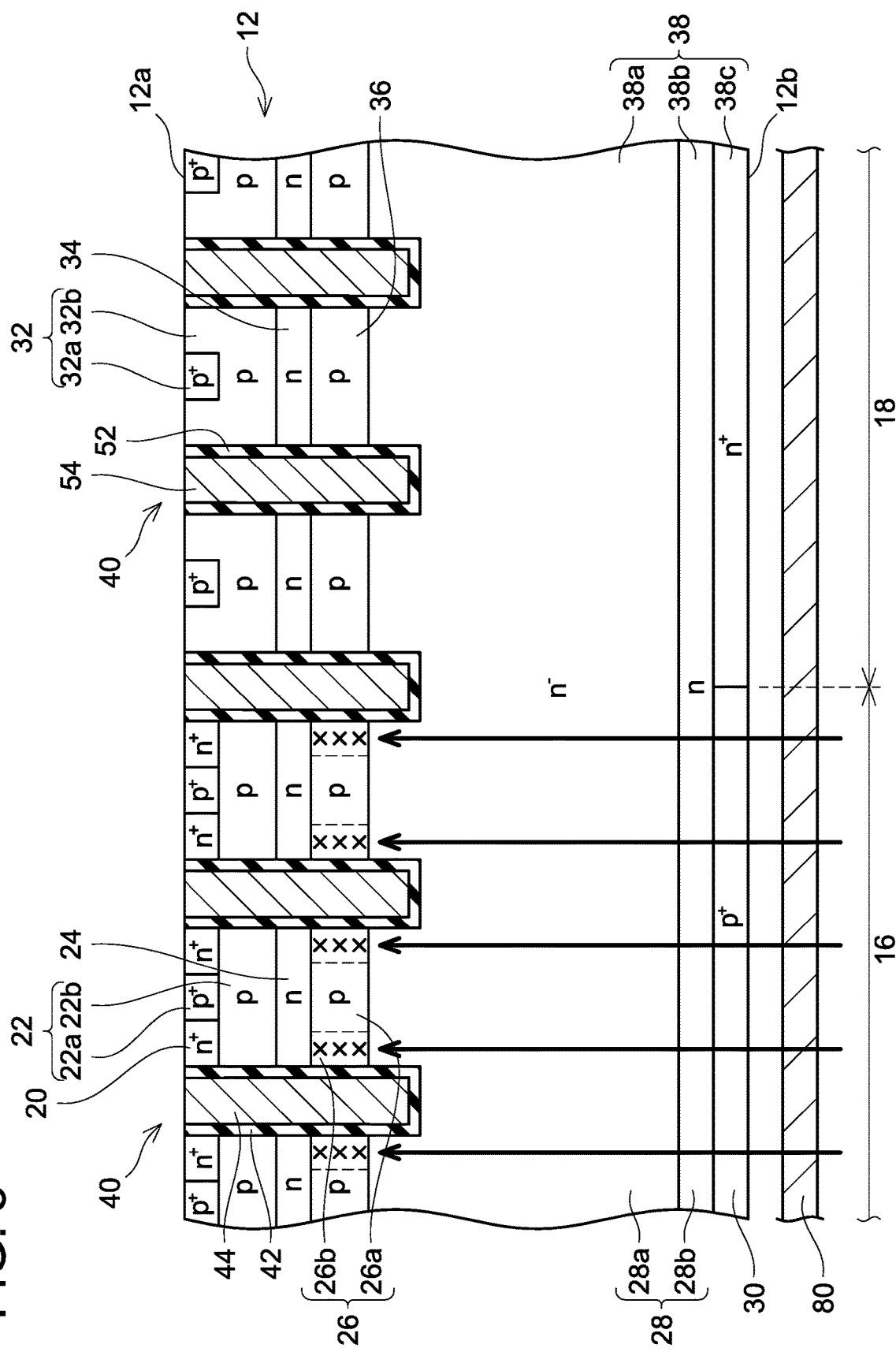
FIG. 8 is an explanatory diagram of the manufacturing process of the semiconductor device 10.

Next, a method of manufacturing the semiconductor device 10 will be described. Firstly, as shown in FIG. 7, the semiconductor substrate 12 in which the trenches 40, the IGBT regions 16, the diode regions 18, and the like have already been formed by conventionally known methods is prepared. Next, as shown in FIG. 8, a mask 80 (such as a silicon mask) is disposed thereon, and charged particles (such as helium ions) are irradiated. In so doing, irradiation energy for the charged particles and a thickness of the mask 80 are adjusted such that the charged particles stop at the lower body region 26 in the vicinities of the gate insulating films 42. Further, an irradiation range of the charged particles is adjusted such that the charged particles are injected only to the vicinities of the gate insulating films 42. That is, the charged particles are irradiated selectively plural times such that the charged particles stop at depths in the lower body region 26 in the vicinities of the gate insulating films 42. High-density crystal defects (that is, the high-density crystal defect ranges 26b) are formed by the irradiated charged particles stopping. Within the lower body region 26, ranges where the charged particles were not irradiated become the low-density crystal defect range 26a.

After this, the interlayer insulating films 46, 56, the upper electrode 60, the lower electrode 62, and the like are formed, by which the semiconductor device 10 shown in FIG. 2 is completed.

Second Embodiment

Figure 9:
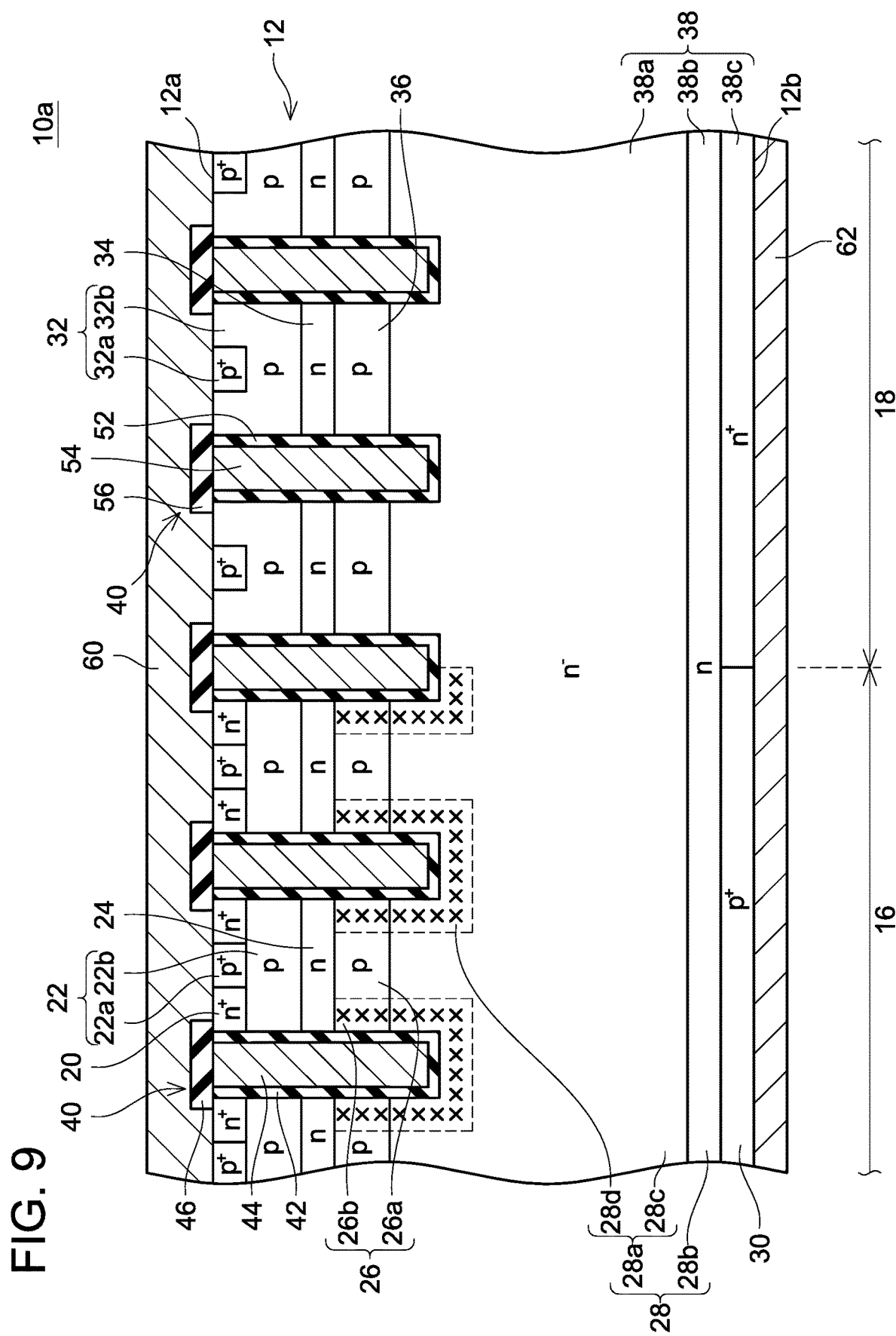
FIG. 9 is a vertical cross-sectional view of a semiconductor device 10a of a second embodiment corresponding to FIG. 2.

Next, a semiconductor device 10a of a second embodiment will be described with reference to FIG. 9. Among configurations of the semiconductor device 10a of the second embodiment, configurations that are the same as those of the semiconductor device 10 of the first embodiment will be omitted for their descriptions. In the semiconductor device 10a of the second embodiment, as shown in FIG. 9, the drift region 28 (specifically, the low-concentration drift region 28a) includes a low-density crystal defect range 28c and high-density crystal defect ranges 28d. A crystal defect density of the high-density crystal defect ranges 28d is higher than a crystal defect density of the low-density crystal defect range 28c.

The high-density crystal defect ranges 28d are disposed in ranges in direct contact with the gate insulating films 42 in the vicinities of the lower ends of the trenches 40 below the lower body region 26. That is, the high-density crystal defect ranges 28d are disposed so as to cover the lower ends of the trenches 40. The low-density crystal defect range 28c surrounds the high-density crystal defect ranges 28d. In this embodiment, the low-density crystal defect range 28c is disposed over an entire region of the low concentration drift region 28a excluding the high-density crystal defect ranges 28d.

In the semiconductor device 10a of the present embodiment, the drift region 28 (that is, the low-concentration drift region 28a) includes the low-density crystal defect range 28c and the high-density crystal defect ranges 28d having the higher crystal defect density than the low-density crystal defect range 28c. Due to this, holes that had flown to the high-density crystal defect ranges 28d of the drift region 28 disappear within a short period of time. Since the high-density crystal defect ranges 28d are disposed in the ranges in direct contact with the gate insulating films 42, the holes are less likely to be accumulated in the drift region 28 in the vicinities of lower ends of the gate insulating films 42. Thus, in this semiconductor device 10a, the negative capacitance effect caused by the holes accumulated in the drift region 28 can be suppressed, and variation in the potential of the gate electrodes 44 caused by the negative capacitance effect is less likely to occur.

A magnitude relationship between the crystal defect density of the high-density crystal defect ranges 28d in the drift region 28 and the crystal defect density of the high-density crystal defect ranges 26b in the lower body region 26 is not limited. The crystal defect density of the high-density crystal defect ranges 28d may be higher, the crystal defect density of the high-density crystal defect ranges 26b may be higher, or the crystal defect densities of these ranges may be substantially same.

Figure 10:
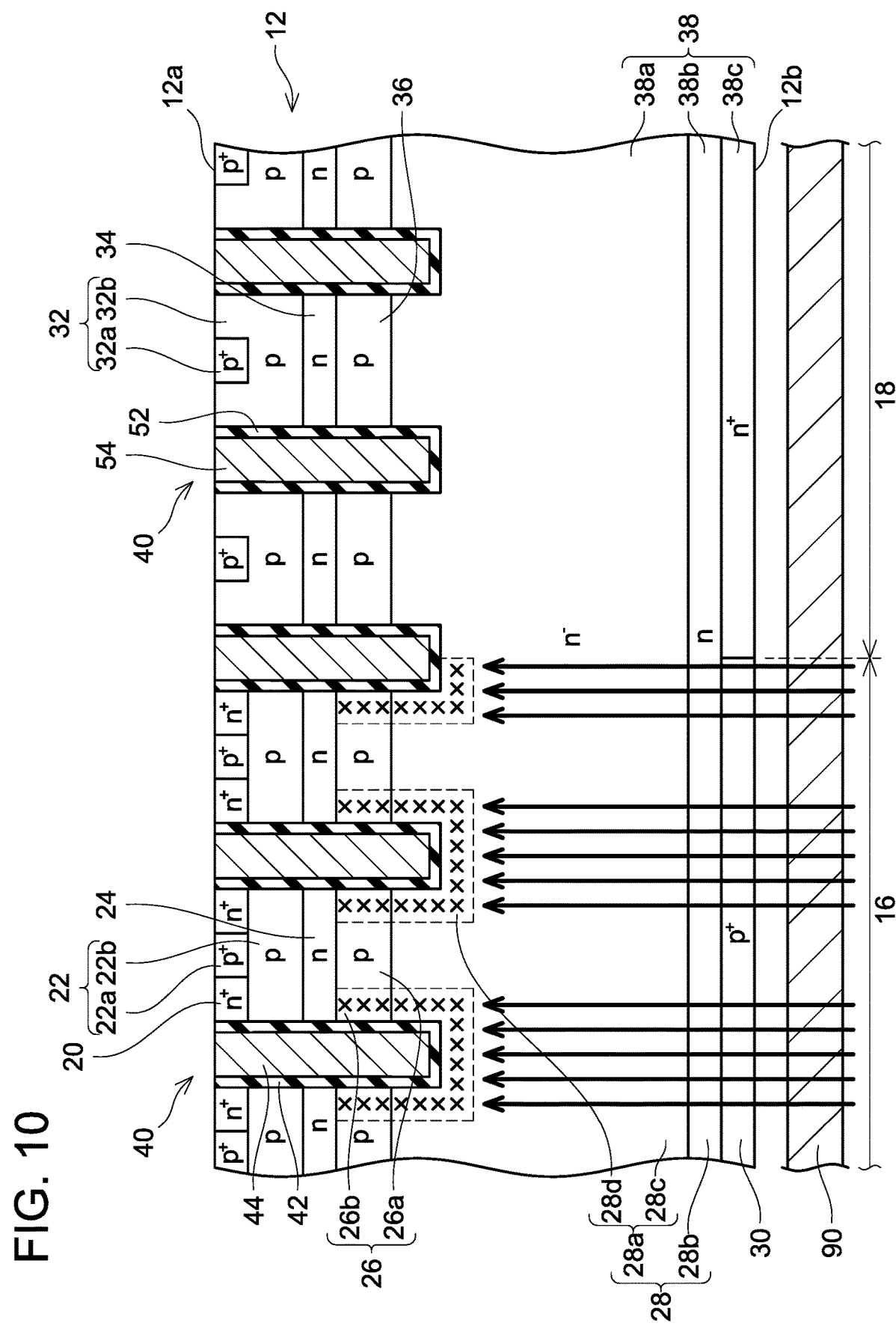
FIG. 10 is an explanatory diagram of a manufacturing process of the semiconductor device 10a of the second embodiment.

Next, a method of manufacturing the semiconductor device 10a will be described. With the semiconductor device 10a, after the crystal defects of the first embodiment shown in FIG. 8 (that is, the high-density crystal defect ranges 26b) have been formed, a mask 90 (such as a silicon mask) thicker than the mask 80 is disposed as shown in FIG. 10 and the charged particles (such as the helium ions) are irradiated. In so doing, the irradiation energy for the charged particles and a thickness of the mask 90 are adjusted such that the charged particles stop at the drift region 28 (that is, the low-concentration drift region 28a) in the vicinities of the lower ends of the gate insulating films 42. Further, the irradiation range of the charged particles is adjusted such that the charged particles are injected only to the vicinities of the gate insulating films 42, That is, the charged particles are irradiated selectively plural times such that the charged particles stop at depths in the drift region 28 in the vicinities of the lower ends of the gate insulating films 42. High-density crystal defects (that is, the high-density crystal defect ranges 28d) are formed by the irradiated charged particles stopping.

After this, the interlayer insulating films 46, 56, the upper electrode 60, the lower electrode 62, and the like are formed, by which the semiconductor device 10a shown in FIG. 9 is completed.

Third Embodiment

Figure 11:
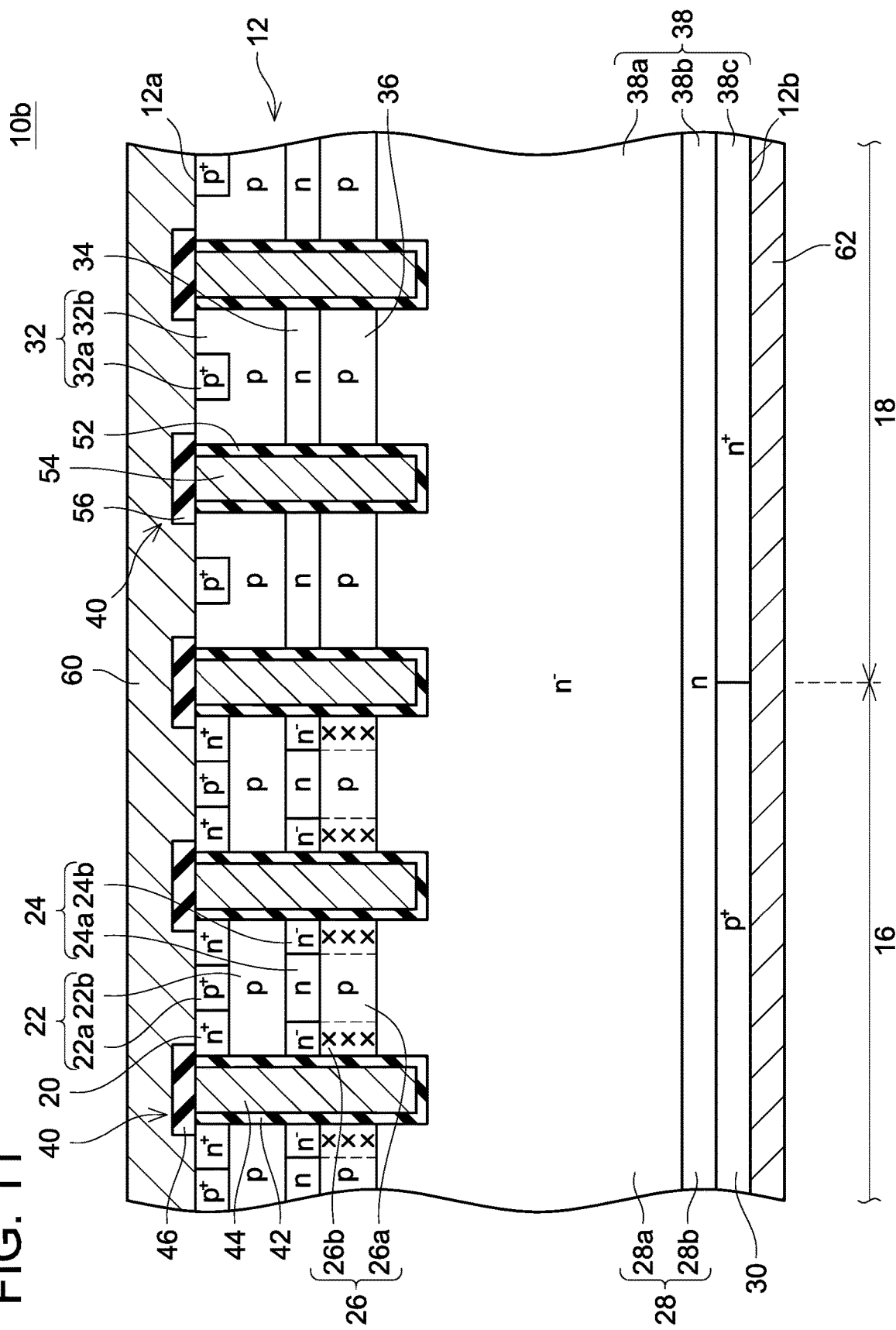
FIG. 11 is a vertical cross-sectional view of a semiconductor device 10b of a third embodiment corresponding to FIG. 2.

Next, a semiconductor device 10b of a third embodiment will be described with reference to FIG. 11. Among configurations of the semiconductor device 10b of the third embodiment, configurations that are the same as those of the semiconductor device 10 of the first embodiment will be omitted for their descriptions. In the semiconductor device 10b of the third embodiment, the IGBT intermediate region 24 includes a high-concentration range 24a and low-concentration ranges 24b. An n-type impurity concentration in the low-concentration ranges 24b is lower than an n-type impurity concentration in the high-concentration range 24a.

The low-concentration ranges 24b are disposed in ranges in direct contact with the gate insulating films 42. The high-concentration range 24a is disposed in direct contact with the low-concentration ranges 24b on a side opposed to the gate insulating films 42. That is, the high-concentration range 24a is disposed between each pair of the trenches 40 by being interposed between a pair of the low-concentration ranges 24b.

In the semiconductor device 10b of the present embodiment, the IGBT intermediate region 24 includes the high-concentration range 24a and the low-concentration ranges 24b having the lower n-type impurity concentration than the high-concentration range 24a. The low-concentration ranges 24b are disposed in the ranges in direct contact with the gate insulating films 42. Due to this, in the vicinities of the gate insulating films 42, a flow of holes flowing from the collector region 30 toward the upper body region 22 is less likely to be suppressed. Thus, in this semiconductor device 10b, the holes are less likely to be accumulated in the lower body region 26 in the vicinities of the gate insulating films 42 (that is, in the high-density crystal defect ranges 26b), As above, in the semiconductor device 10b, the accumulation of the holes in the high-density crystal defect ranges 26b is suppressed by the high-density crystal defect ranges 26b and the low-concentration ranges 24b. Thus, in this semiconductor device 10b, the negative capacitance effect can further be suppressed. The configuration of the IGBT intermediate region 24 of the present embodiment may be applied to the semiconductor device 10a of the second embodiment.

In the aforementioned embodiments, the high-density crystal defect ranges 26b of the lower body region 26 and the high-density crystal defect ranges 28d of the drift region 28 may not be disposed in the vicinities of all of the trenches 40 in each of the IGBT regions 16. That is, the high-density crystal defect ranges 26b of the lower body region 26 and the high-density crystal defect ranges 28d of the drift region 28 may not be disposed in the vicinities of one or more trenches 40 in the IGBT regions 16.

Figure 12:
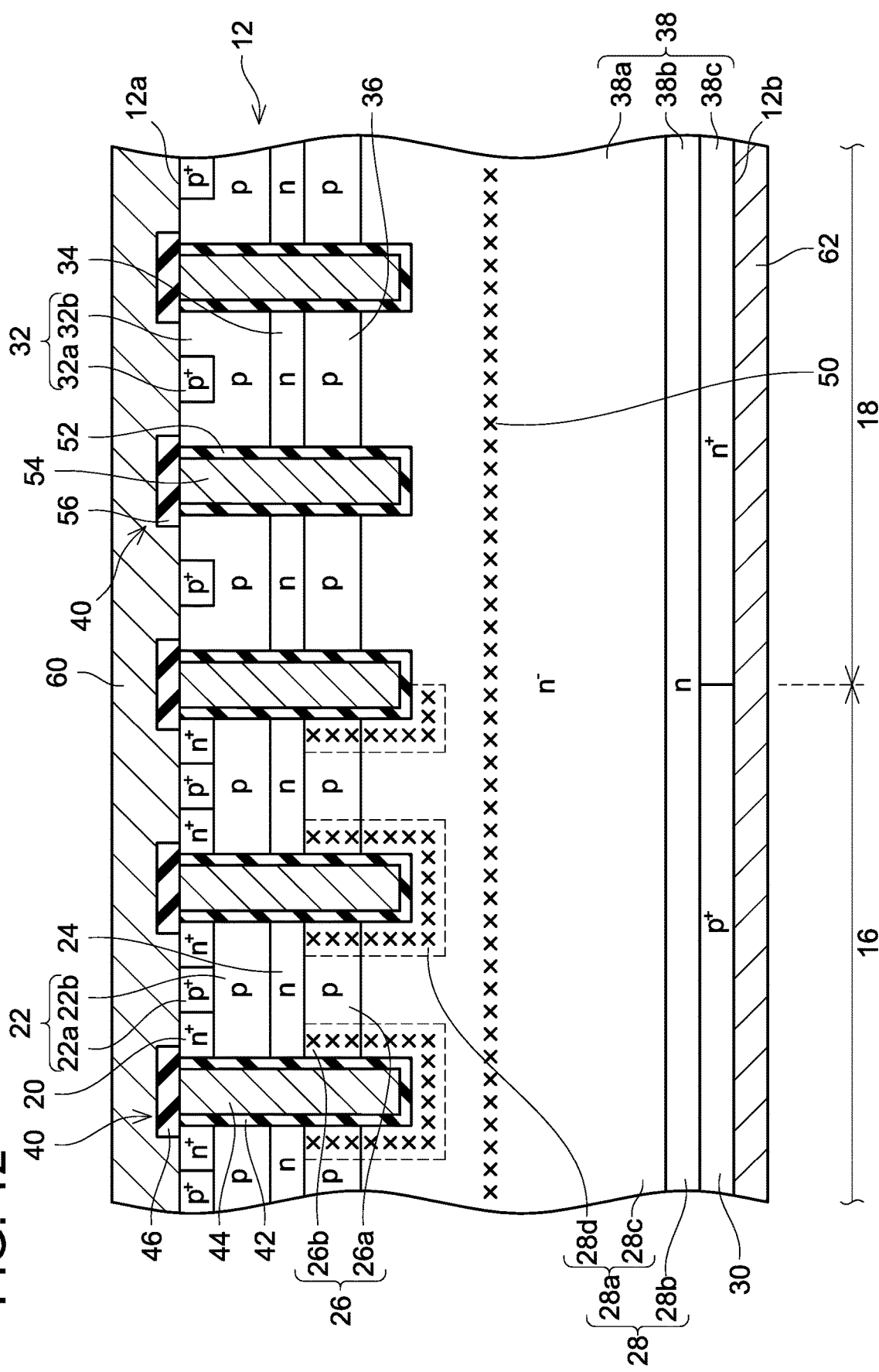
FIG. 12 is a vertical cross-sectional view of a semiconductor device of a variant corresponding to FIG. 2.

Further, in the aforementioned second embodiment, the low-density crystal defect range 28c simply needs to surround the high-density crystal defect ranges 28d, and a range with a high crystal defect density may be provided at a position in the low-concentration drift region 28a other than the positions where the high-density crystal defect ranges 28d are located. For example, as shown in FIG. 12, a lifetime control region 50 having a high crystal defect density may be provided in the low-concentration drift region 28a and the low-concentration drift region 38a. The lifetime control region 50 may be distributed in a layer shape in a plane direction of the semiconductor substrate 12 from the low-concentration drift region 28a to the low-concentration drift region 38a. A depth at which the lifetime control region 50 is provided is not particularly limited. Further, the lifetime control region 50 may be provided in the semiconductor devices of other embodiments.

When each IGBT is turned off, holes that existed in the drift region 28 during when the IGBT was on are discharge to the upper electrode 60 through the upper body region 22. Due to this, a tail current flows in the IGBT upon its turn-off. When the tail current is large, a turn-off loss of the IGBT becomes large. However, by having the lifetime control region 50 in the low-concentration drift region 28a, the holes in the drift region 28 disappear by recombining in the lifetime control region 50 when the IGBT is turned off. Thus, according to the above configuration, the tail current can be mitigated. Due to this, the turn-off loss is small.

Further, when each diode is switched from on to off, the diode performs the reverse recovery operation and the reverse recovery current flows in the diode, so a loss is thereby generated. However, by having the lifetime control region 50 with the high crystal defect density in the low concentration drift region 38a of the diode region 18, a large number of holes in the low-concentration drift region 38a disappear by recombining in the lifetime control region 50 when the diode performs the reverse recovery operation. As above, according to the above configuration, the flow of the holes in the reverse recovery operation of the diode (that is, the recovery current) is suppressed, and the loss is thereby reduced.

Further, in the aforementioned third embodiment, the IGBT intermediate region 24 includes the high-concentration range 24a and the low-concentration ranges 24b, and the n-type impurity concentration of the high-concentration range 24a is higher than the n-type impurity concentration of the low-concentration ranges 24b. However, the n-type impurity concentration of the IGBT intermediate region 24 may become gradually lower at its portions farther away from the gate insulating films 42. That is, the IGBT intermediate region 24 may have a highest n-type impurity concentration at positions in direct contact with the gate insulating films 42 and a lowest n-type impurity concentration at a midpoint position between each pair of the trenches 40.

Figure 13:
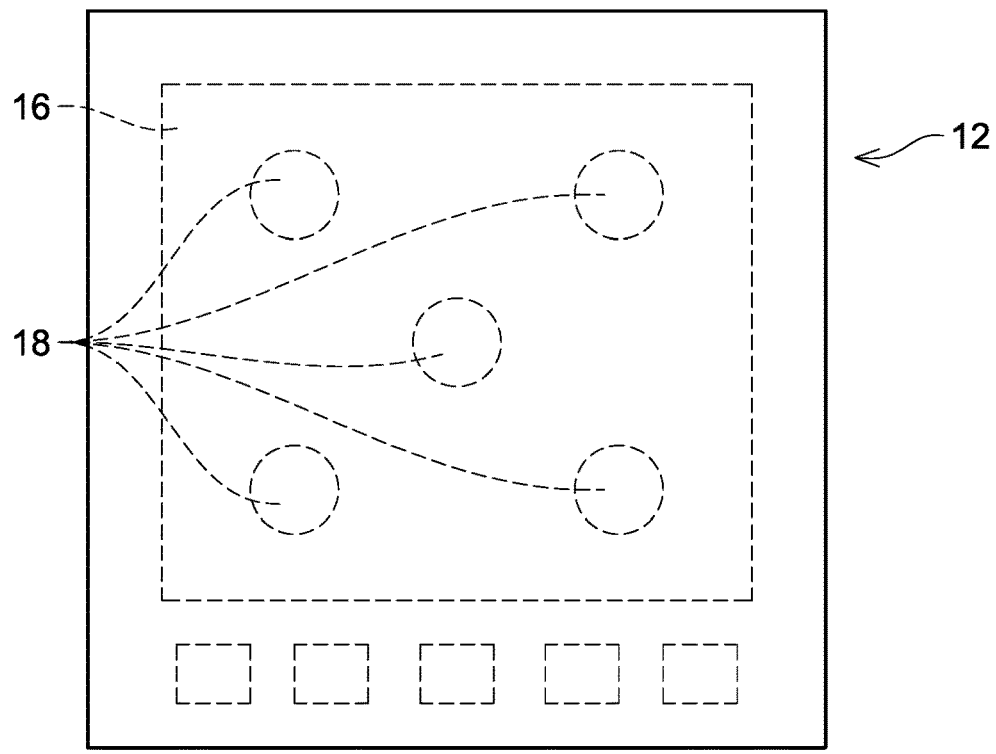
FIG. 13 is a top view of a semiconductor device of another variant corresponding to FIG. 1.
Figure 14:
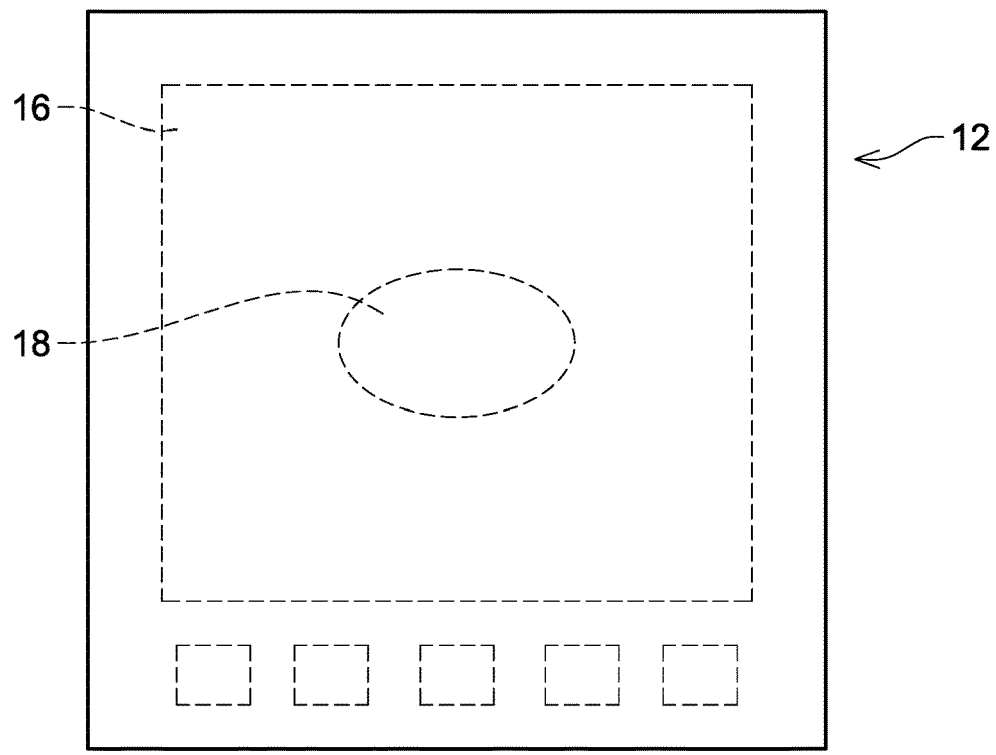
FIG. 14 is a top view of a semiconductor device of yet another variant corresponding to FIG. 1.
Figure 15:
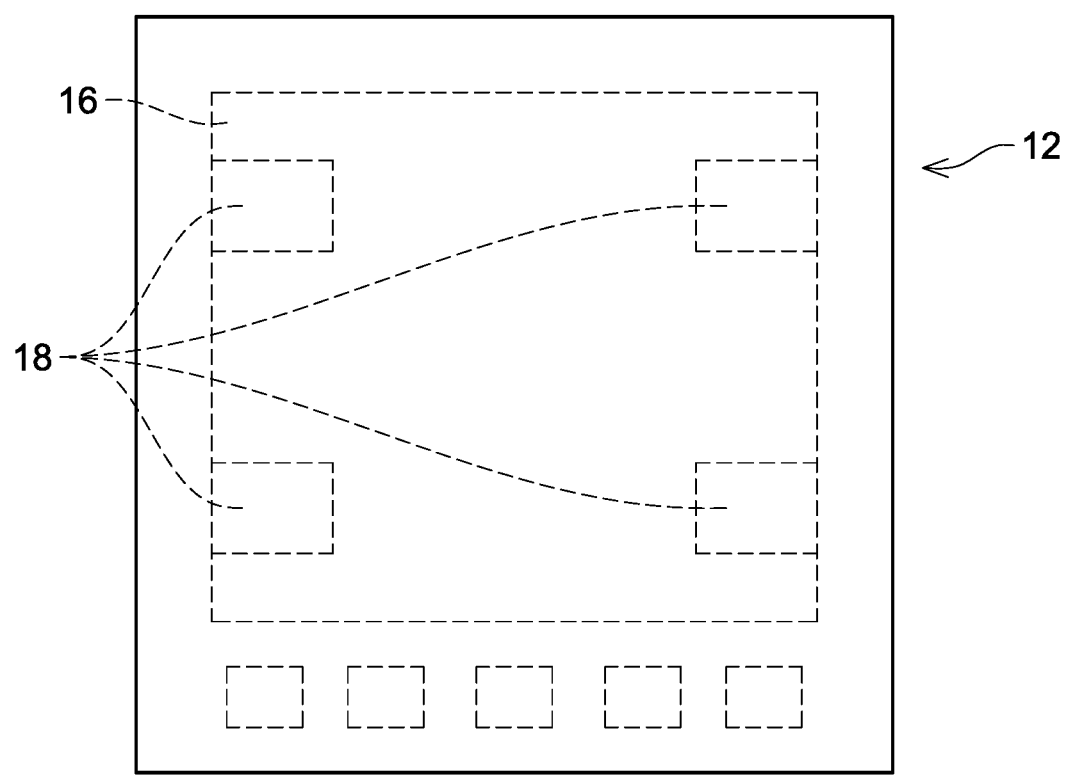
FIG. 15 is a top view of a semiconductor device of still another variant corresponding to FIG. 1.

Further, in the aforementioned embodiments, as shown in FIG. 1, the IGBT regions 16 and the diode regions 18 are disposed alternately by being repeated one after another along one direction. However, for example as shown in FIGS. 13 to 15, the IGBT region 16 and the diode region(s) 18 may be disposed in other arrangements. Further, in the technique disclosed herein, the semiconductor device may not include any diode region 18.

(Corresponding Relationships)

The IGBT intermediate region 24 is an example of an intermediate region. The low-density crystal defect range 26a is an example of a first range. The high-density crystal defect range 26b is an example of a second range. The high-concentration range 24a is an example of a third range. The low-concentration range 24b is an example of a fourth range. The low-density crystal defect range 28c is an example of a fifth range. The high-density crystal defect range 28d is an example of a sixth range.

Some of the features characteristic to the technology disclosed herein will be listed below. It should be noted that the respective technical elements are independent of one another, and are useful solely or in combinations.

In a configuration disclosed herein as an example, the intermediate region may include a third range and a fourth range that has a lower n-type impurity concentration than the third range. The fourth range may be in direct contact with the gate insulating film. The third range may be in direct contact with the fourth range on a side opposed to the gate insulating film.

In this configuration, the flow of holes flowing from the collector region toward the upper body region is less likely to be suppressed. Thus, the holes are less likely to be accumulated in the lower body region in the vicinity of the gate insulating film. Thus, according to this configuration, the variation in the gate voltage caused by the negative capacitance effect upon turn-on of the semiconductor device is less likely to occur.

In a configuration disclosed herein as an example, the drift region may include a fifth range and a sixth range that has a higher crystal defect density than the fifth range. The sixth range may be in direct contact with the gate insulating film. The fifth range may surround the sixth range.

In this configuration, holes that had flown from the collector region to the sixth range of the drift region disappear in a short period of time. Since the sixth range is disposed in the range in direct contact with the gate insulating film, the holes are less likely to be accumulated in the drift region in the vicinity of the lower end of the gate insulating film. Thus, according to this configuration, the variation in the gate voltage caused by the negative capacitance effect upon the turn-on of the semiconductor device is less likely to occur.

In a method of manufacturing the semiconductor device disclosed herein as an example, the method may include forming the second range by injecting charged particles into the semiconductor substrate. The method may include forming the sixth range by injecting charged particles into the semiconductor substrate.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A semiconductor device comprising:
   a semiconductor substrate;
   a trench provided in an upper surface of the semiconductor substrate;
   a gate insulating film covering an inner surface of the trench; and
   a gate electrode disposed in the trench and insulated from the semiconductor substrate by the gate insulating film,
   wherein
   the semiconductor substrate comprises:
   an emitter region of n-type disposed at the upper surface of the semiconductor substrate and being in direct contact with the gate insulating film;
   an upper body region of p-type being in direct contact with the gate insulating film below the emitter region;
   an intermediate region of n-type being in direct contact with the gate insulating film below the upper body region;
   a lower body region of p-type being in direct contact with the gate insulating film below the intermediate region;
   a drift region of n-type being in direct contact with the gate insulating film below the lower body region; and
   a collector region of p-type being in direct contact with the drift region from below,
   wherein
   the lower body region includes a first range and a second range that has a higher crystal defect density than the first range,
   the second range is in direct contact with the gate insulating film, and
   the first range is in direct contact with the second range on a side opposed to the gate insulating film.

2. The semiconductor device of claim 1, wherein
   the intermediate region includes a third range and a fourth range that has a lower n-type impurity concentration than the third range,
   the fourth range is in direct contact with the gate insulating film, and
   the third range is in direct contact with the fourth range on a side opposed to the gate insulating film.

3. The semiconductor device of claim 1, wherein
   the drift region includes a fifth range and a sixth range that has a higher crystal defect density than the fifth range,
   the sixth range is in direct contact with the gate insulating film, and
   the fifth range surrounds the sixth range.

4. A method of manufacturing the semiconductor device of claim 3, the method comprising:
   forming the sixth range by injecting charged particles into the semiconductor substrate.

5. A method of manufacturing the semiconductor device of claim 1, the method comprising:
   forming the second range by injecting charged particles into the semiconductor substrate.

* * * * *